United States Patent [19]

Miller

[11] Patent Number: 4,750,149
[45] Date of Patent: Jun. 7, 1988

[54] PROGRAMMABLE FIFO BUFFER

[75] Inventor: Michael J. Miller, San Jose, Calif.

[73] Assignee: Integrated Device Technology, Inc., Santa Clara, Calif.

[21] Appl. No.: 882,132

[22] Filed: Jul. 3, 1986

[51] Int. Cl.⁴ .............................................. G06F 3/00
[52] U.S. Cl. ................................................... 364/900
[58] Field of Search ... 364/200 MS File, 900 MS File

[56] References Cited

U.S. PATENT DOCUMENTS

| | | | |
|---|---|---|---|
| 4,298,936 | 11/1981 | Shapiro | 364/200 |
| 4,497,041 | 1/1985 | Braun | 364/900 |

*Primary Examiner*—Raulfe B. Zache
*Attorney, Agent, or Firm*—Thomas E. Schatzel

[57] ABSTRACT

A programmable FIFO buffer is disclosed which including a (serial) input register, a control register, a (parallel-input parallel-output-type) FIFO buffer, a (serial) output register, and another control register. The input register is for receiving signals representing in serial format a word of data and for developing signals representing the data word converted to parallel format. The former control register is for controlling the serial-to-parallel conversion process. The (parallel-input parallel-output-type) FIFO buffer is for storing the data word. The output register is for receiving from the buffer, signals representing in parallel format a word of data stored in the buffer and for developing signals representing the stored data word converted to serial format. And, the latter control register is for controlling the parallel-to-serial conversion process.

9 Claims, 2 Drawing Sheets

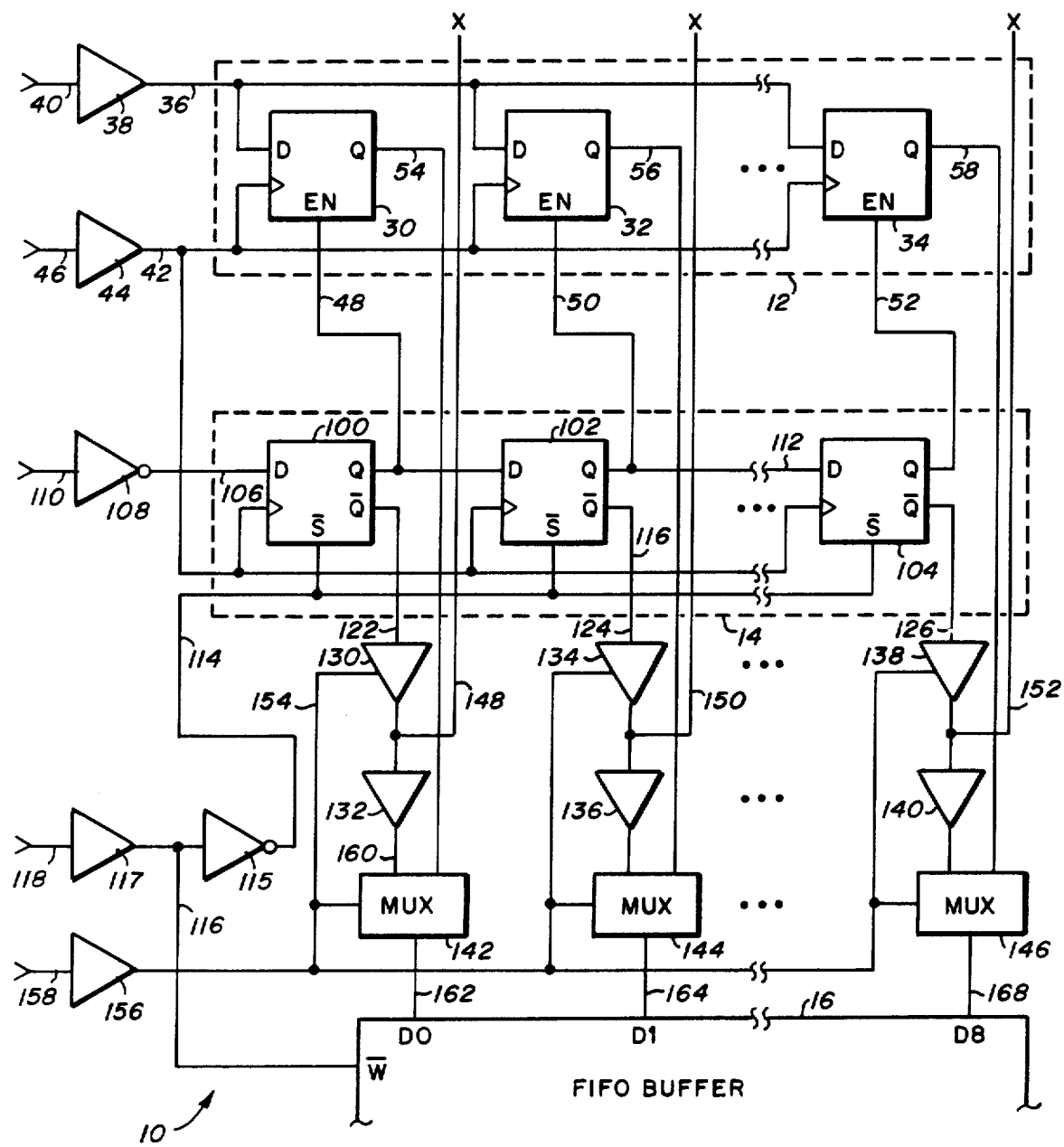
Fig_1A

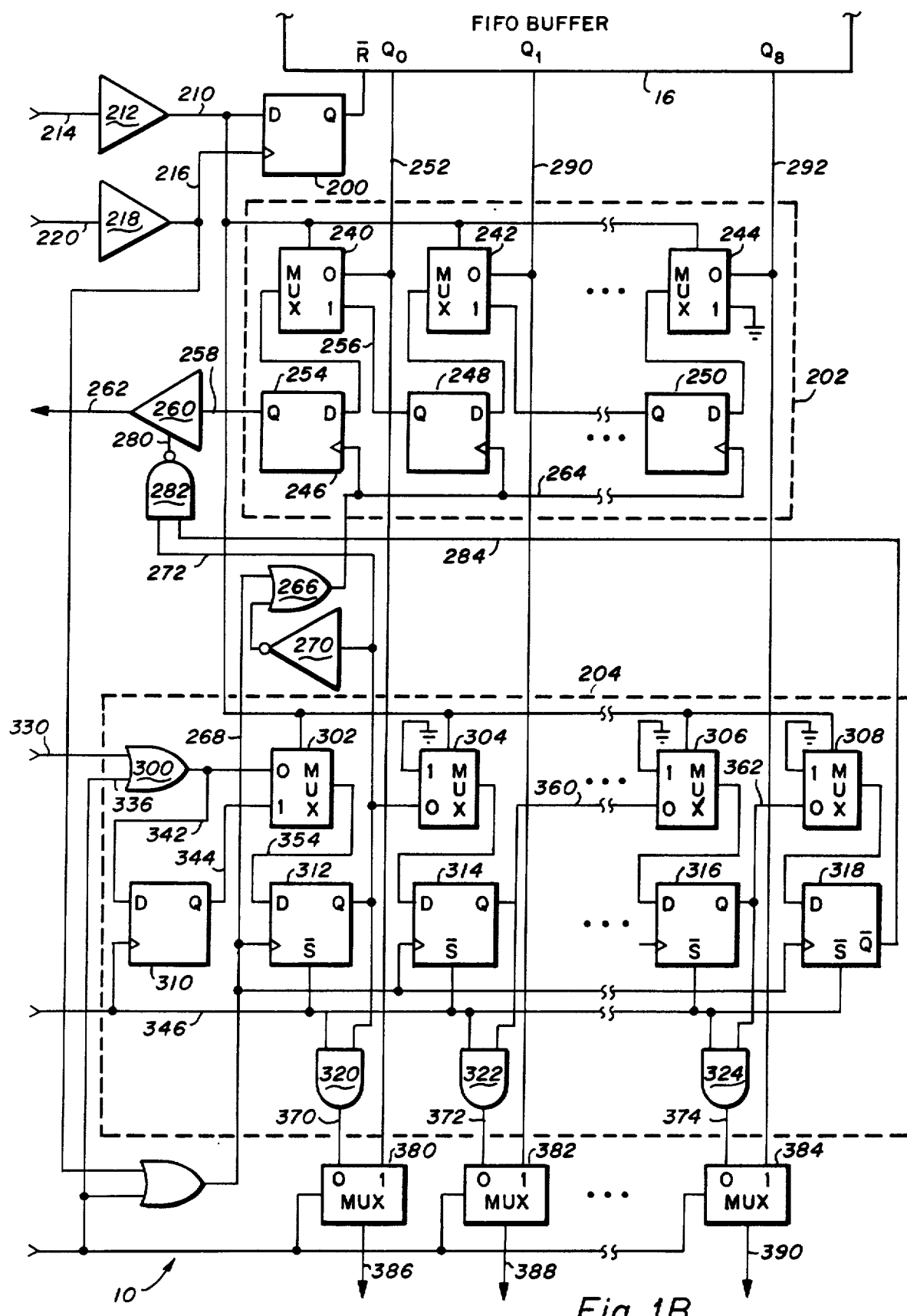
Fig_1B

PROGRAMMABLE FIFO BUFFER

BACKGROUND OF THE INVENTION

1. Field of the Invention

The present invention relates to integrated circuits generally and more specifically to a FIFO buffer having programmable serial-parallel-serial conversion.

2. Description of the Prior Art

A FIFO (first-in-first-out) buffer is a shift register having an additional control section that permits input data to "fall through" to the first vacant stage. In other words, if there is data stored in the FIFO buffer, it is available at the output even though all of the stages are not filled. Thus, in effect, a FIFO buffer operates as a "variable-length" shift register, the length of which is always the same as the data stored therein. (Of late, many FIFO buffers are implemented with random access memories and counters.)

As such, FIFO buffers are particularly suited for use in applications in which there is a need to compensate for differences in the rate of flow of data. (For example, FIFO buffers are particularly suited for use in storing data which is to be encoded and to be written onto a disk and/or which has been read off of a disk and has been decoded. Also, FIFO buffers are particularly suited for use in storing data representing the individual dots comprising a frame of a video display before the dots are clocked out to drive the display. Further, FIFO buffers are particularly suited for use in storing data which is to be transmitted and/or which has been received in a data acquisition system.)

Many of these applications, however, also require that the format of the data be converted from serial-to-parallel and/or from parallel-to-serial format. Of course, circuitry is available which will perform the necessary serial-to-parallel and/or parallel-to-serial format conversion. Unfortunately, the use of additional circuitry adds to the system cost and complexity. Further, most serial-to-parallel and/or parallel-to-serial format conversion circuitry is designed for a specific (common) word length (number of bits) which may not be optimal for the particular application.

SUMMARY OF THE PRESENT INVENTION

It is therefore the primary object of the present invention to provide a FIFO buffer having programmable serial-parallel-serial format conversion with adjustable word length.

Another object of the present invention is to provide a FIFO buffer having serial-parallel-serial format conversion all integrated into a single device that has a minimal number of pins.

Briefly, the presently preferred embodiment of the present invention includes a (serial) input register for receiving signals representing in serial format a word of data and for developing signals representing the data word converted to parallel format, a control register for controlling the serial-to-parallel conversion process, a (parallel-input parallel-output-type) FIFO buffer for storing the data word, a (serial) output register for receiving from the buffer, signals representing in parallel format a word of data stored in the buffer and for developing signals representing the stored data word converted to serial format, and another control register for controlling the parallel-to-serial conversion process.

The ability to provide a FIFO buffer having programmable serial-parallel-serial format conversion with adjustable word length is the principal advantage of the present invention.

Another advantage of the present invention is the ability it affords to provide a FIFO buffer having serial-parallel-serial format conversion all integrated into a single device that has a minimal number of pins.

These and other objects and advantages of the present invention will no doubt be obvious to those skilled in the art after having read the following detailed description of the presently preferred embodiment which is illustrated in the figures of the drawing.

IN THE DRAWING

FIGS. 1A and 1B taken together show a schematic diagram of the presently preferred embodiment in accordance with the present invention of a FIFO buffer having programmable serial-parallel-serial format conversion with adjustable word length.

DETAILED DESCRIPTION OF THE PREFERRED EMBODIMENT

In accordance with the present invention, illustrated in FIGS. 1A and 1B of the drawing generally designated by the number 10 is the presently preferred embodiment of a (4K×9) FIFO buffer having programmable serial-parallel-serial format conversion with adjustable word length. With reference to FIG. 1A of the drawing, FIFO buffer 10 is shown to include a (serial) input register, which is designated 12, a control register, which is designated 14, and a (parallel-input parallel-output-type) FIFO buffer, which is designated 16.

Input register 12 has nine, D-type flip flops, represented by three flip flops, which are respectively designated 30, 32, and 34. The flip flops are configured to receive signals representing in serial format a word of data and to develop signals representing the data word converted to parallel format. More particularly, the data input (D) of each of the flip flops of input register 12 (including flip flops 30, 32, and 34) is connected to a line 36 which is coupled by an (amplifying-type) buffer 38 to a line (pin) 40 to receive a FIFO buffer 10 driving, serial (datail) input signal. Similarly, the clock input of each of the input register 12 flip flops is connected to a line 42 which is coupled by a buffer 44 to a line 46 to receive a FIFO buffer 10 driving, serial data (in) clocking signal. The enable input (EN) of each of the input register 12 flip flops is connected to a corresponding one of nine lines, represented by three lines, which are respectively designated 48, 50, and 52; and, the data output (Q) of each of the flip flops is connected to a corresponding one of another nine lines, represented by three lines, designated 54, 56, and 58.

Control register 14, which controls the serial-to-parallel conversion process, also has nine D-type flip flops, represented by three flip flops, which are respectively designated 100, 102, and 104. In one embodiment, the flop flops of control register 14 are connected in cascade. More specifically, the data input of flip flop 100 is connected to a line 106 which is coupled by an inverter 108 to a line 110 to receive a FIFO buffer 10 driving, serial extending signal. The (active high) data output (Q) of flip flop 100 is connected to the data input of flip flop 102 by line 48. The data output of flip flop 102 is connected to the data input of the next higher order flip flop by line 50; and, the data input of flip flop 104 is connected to the data output of the next lower order flip flop by a line 112. Connected to line 42 is the clock input of each of the flip flops of register 14 (including flip flops 100, 102, and 104). The (active low) set (/S) input of each of the flip flops is connected to a line 114 which is coupled by an inverter 115, a line 116, and a buffer 117 to a line 118 to receive a FIFO buffer 10 driving, write controlling signal. Finally, the active-low data output (/Q) of each of the control register 14 flip flops (represented by flip flops 100, 102, and 104) is connected to a corresponding one of nine lines, represented by three lines, designated 122, 124, and 126.

Additionally, FIFO buffer 10 includes nine pairs of buffers, represented by three pairs of buffers, respectively designated 130 and 132, 134 and 136, and 138 and 140, and nine multiplexers, represented by three multiplexers, respectively designated 142, 144, and 146. Buffers 130, 134, and 138 are each of the type which have a tri-state output. The multiplexers (MUX) (142, 144, and 146) are each of the type which develops at a data output a signal the state of which corresponds to the state of a signal developed at a selected one of two data inputs, the selected input being designated by the binary state of a signal developed at a control input.

The additional buffers and multiplexers are configured to couple to FIFO buffer 16 either the nine signals developed by input register 12 in the serial mode or, in the parallel mode, nine FIFO buffer 10 driving, parallel (data) input signals which are developed on nine lines represented by three lines respectively designated 148, 150, and 152. Further, in the serial mode, the additional buffers couple to the lines represented by lines 148, 150, and 152 signals which are developed by control register 14 and which delineate the current data word bit. More specifically, buffers 130 and 132 and multiplexer 142 are configured with the (data) input of buffer 130 connected to line 122. The tri-state output controlling input of buffer 130 is connected to a line 154 which is coupled by a buffer 156 to a line 158 to receive a FIFO buffer 10 driving, parallel-input/serial-input, mode controlling signal. The buffer 130 data output connected to line 148.

The input of buffer 132 is connected to line 148; and, the output of the buffer is connected to one of the data inputs of multiplexer 142 by a line 160. The other data input of multiplexer 142 is connected to line 54; the control input of the multiplexer is connected to line 154; and, the multiplexer output is coupled to a corresponding one of the nine parallel data inputs of FIFO buffer 16 by a line 162. The other buffers and multiplexers are similarly configured, buffers 134 and 136 and multiplexer 144 to couple to a line 164 to drive the corresponding data input of FIFO buffer 16 either the signal developed by input register 12 on line 56 or the signal developed on line 150; and buffers 138 and 140, and multiplexer 146 to couple to a line 168 to drive the corresponding data input of FIFO buffer 16 either the signal developed by input register 12 on line 58 or the signal developed on line 152.

FIFO buffer 16, which is of (4K×9) size, is of conventional design for receiving signals representing in parallel format words of data, for storing the data words, and for developing signals representing in parallel format stored data words.

For parallel operation, a parallel-input/serial-input, mode controlling signal having a high-logic-level is (externally) developed on line 158. Signals representing a word of data to be buffered (stored) are (externally) developed on (the nine lines represented by) lines 148, 150, and 152 and written into FIFO buffer 16 by the rising edge of a write controlling signal (externally) developed on line 118.

For serial (mode) operation, first, the desired word length is "programmed" by connecting to line 118 one of the (nine lines represented by) lines 148, 150, and 152. (Line 148 is chosen for a one bit word length; line 150 is chosen for a two bit word length; and, line 152 is chosen for a nine bit word length.) A serial extending signal having a high-logic-level is (externally) developed on line 110; and, on line 158, a parallel-input/serial-input, mode controlling signal having a low-logic-level is (externally) developed.

As will become apparent shortly, at the beginning of each data word, the signal (internally) developed on the line which has been connected to line 118 rises to a high-logic-level coincident with (the rising edge of) a cycle of a serial data (in) clocking signal (externally) developed on line 46. Responsive to the high-logic-level of the signal developed on line 118 (the flip flops represented by) flip flops 100, 102, and 104 are "set" to the state in which they develop the signals on lines 48, 50, and 52 so as to have a high-logic-level and, the signals on (lines 122, 124, and 126 so as to have a low-logic-level, thus, developing the signals on) lines 148, 150, and 152 so as to have a low-logic-level. Responsive to the high-logic-level of the signals developed on lines 48, 50, and 52 (all of) the flip flops of input register 12 (represented by flip flops 30, 32, and 34) are "enabled" to receive the first bit of the data word represented by a (serial input) signal (externally) developed on line 40.

With the rising edge of the next cycle of the serial data (in) clocking signal (externally) developed on line 46, the first bit of the data word is "clocked" into all of the flip flops of input register 12 (including flip flops 30, 32, and 34). Further, the state of flip flop 100 is changed, causing the flip flop to develop the signal on line 48 so as to have a low-logic-level and to develop the signal on line 148 so as to have a high-logic-level. Responsive to the low-logic-level of the signal developed on line 48 flip flop 30 is "disabled" from receiving the next (second) bit of the data word. And, of course, the logic level of the signal developed (on line 48) at the data input of flip flop 102 is no longer high, "preparing" the flip flop to change state with the (rising edge of the) next cycle of the serial data (in) clocking signal developed on line 46.

With the (rising edge of the) next cycle of the serial data (in) clocking signal developed on line 46, the second bit of the data word is "clocked" into flip flops 32 and 34 (but not flip flop 30 which is storing the first data word bit). Also, the signal is developed on line 50 so as to have a low-logic-level, "disabling" flip flop 32; and, the signal is developed on line 150 so as to have a high-logic-level.

The process continues until the level of the signal developed on the line (chosen from the lines represented by lines 148, 150, and 152) which is connected to line 118 rises to a high-logic-level. Responsive to the high-logic-level of the signal developed on line 118 the bits of the data word stored in the flip flops of input register 12 (including flip flops 30, 32, and 34) are written (in parallel format) into FIFO buffer 16. Additionally, (the flip flops represented by) flip flops 100, 102, and 104 are again "set" preparing the flip flops to receive the first bit of the next data word.

For data word lengths longer than nine bits, FIFO buffer 10 is connected in cascade with one or more similar buffers. More particularly, line 40 is connected to the similar line of each of the other buffers to be (externally) driven in parallel by a serial input signal. Also, to be (externally) driven in parallel by a serial data (in) clocking signal, line 46 is connected to the similar line of each of the other buffers. The desired word length is "programmed" by connecting one of the (nine lines represented by) lines 148, 150, and 152 of the appropriate FIFO buffer to line 118 of all of the FIFO buffers. A serial extending signal having a high-logic-level is (externally) developed on line 110 of the first FIFO buffer; and, line 110 of each of the subsequent FIFO buffers is connected to line 152 of the previous FIFO buffer. Finally, on line 158, a parallel-input/serial-input, mode controlling signal having a low-logic-level is (externally) developed.

Turning now to FIG. 1B of the drawing, FIFO buffer 10 is shown to additionally include another D-type flip flop 200, a (serial) output register 202, and another control register 204. Flip flop 200 is configured with the flip flop data input connected to a line 210 which is coupled by a buffer 212 to a line 214 to receive a FIFO buffer 10 driving (active low) read controlling signal. The clock input of flip flop 200 is connected to a line 216 which is coupled by a buffer 218 to a line 220 to receive another FIFO buffer 10 driving, serial data (out) clocking signal. Finally, the data output of flip flop 200 is coupled to the read input of FIFO buffer 16.

Output register 202 has nine more multiplexers, represented by three multiplexers, respectively designated 240, 242, and 244, and nine more flip flops, represented by three flip flops, respectively designated 246, 248, and 250. The multiplexers and flip flops of output register 202 are configured to receive from FIFO buffer 16, signals representing in parallel format a word of data stored in the buffer and to develop signals representing the stored data word converted to serial format.

The combination of one multiplexer and one flip flop form one of nine similar stages of output register 202. The multiplexer (240) and flip flop (246) forming the first stage receive a signal which is developed on a line 252 by FIFO buffer 16 and which represents the first data word bit. For this purpose, multiplexer 240 is configured with the multiplexer control input connected to line 210, the multiplexer data output coupled to the data input of flip flop 246 by a line 254, one of the multiplexer data inputs connected to line 252, and the other multiplexer data input coupled to the data output of flip flop 248 by a line 256. The data output of flip flop 246 is connected to a line 258 that is coupled by a buffer 260 to a line 262 on which FIFO buffer 10 develops a serial (data) output signal. The clock input of flip flop 246 is coupled by a line 264 to the output of a 2-input OR gate 266, the inputs of which are connected one to a line 268 and the other to an inverter 270 the input of which is connected to a line 272.

Buffer 260 is also of the type which has a tri-state output. The tri-state output controlling input of buffer 260 is coupled by a line 280 to the output of a 2-input NAND gate 282, the inputs of which are connected one to line 272 and the other to a line 284.

Multiplexer 242 and flip flop 248 form the second stage which receives a signal representing the second data word bit developed on a line 290 by FIFO buffer 16; and, a signal representing the ninth data word bit developed by the buffer on a line 292 is received by the ninth stage which is formed by multiplexer 244 and flip flop 250.

Control register 204, which controls the parallel-to-serial conversion process, has a 2-input OR gate 300; ten more multiplexers, represented by four multiplexers, respectively designated 302, 304, 306, and 308; another D-type flip flop 310; ten more D-type flip flops, represented by four flip flops, respectively designated 312, 314, 316, and 318; and nine 2-input AND gates, represented by three gates, respectively designated 320, 322, and 324. In the presently preferred embodiment, gate 300 is configured with one of the gate inputs connected to a line 330 to receive another FIFO buffer 10 driving, serial extending signal and with the other one of the gate inputs connected to a line 336 to receive another FIFO buffer 10 driving, parallel-output/serial-output, mode controlling signal. The output of gate 300 is coupled by a line 342 both to one of the data inputs of multiplexer 302 and to the data input of flip flop 310. The other data input of multiplexer 302 is coupled by a line 344 to the data output of flip flop 310, the clock input of which is connected to a line 346 to receive a FIFO buffer 10 driving, serial output resetting signal.

The combination of one multiplexer and one of the flip flops represented by flip flops 312, 314, 316, and 318 form one of ten similar stages of output register 204. The multiplexer (302) and flip flop (312) forming the first stage receive the serial extending signal which is developed on line 342 and develop on a line 352 a signal which is of similar state but which is delayed one clock period. For this purpose, multiplexer 302 is configured with the multiplexer control input connected to line 210 and the multiplexer data output coupled to the data input of flip flop 312 by a line 354. The data output of flip flop 312 is coupled by line 272 to one of the data inputs of multiplexer 304, the other data input of the multiplexer, as well as the similiar input of each of the other multiplexers of control register 204, being coupled to a low-logic-level potential. The clock input of each of the flip flops represented by flip flops 312, 314, 316, and 318 are connected to receive the clocking signal developed on line 268; and, the (active low) set (/S) input of the flip flops are connected to receive the serial output resetting signal developed on line 346.

Multiplexer 304 and flip flop 314 form the second stage which develops on a line 360 a signal which is delayed another clock period; and, a signal delayed nine clock periods is developed on a line 362 by the ninth stage which is formed by multiplexer 306 and flip flop 316. The tenth stage, which is formed by multiplexer 308 and flip flop 318 develops on line 284 an (active low) signal which is delayed still another clock period.

In another embodiment, an (asynchronous) control register configuration similar to that shown (in FIG. 1A) for control register 14 is employed for control register 204. In the presently preferred embodiment, a (synchronous) control register configuration similar to that shown for control register 204 is employed for control register 14. However, the last stage is not used and the the other data input of each of the multiplexers, represented by multiplexers 304 and 306, is coupled to a high-logic-level potential.

The nine gates represented by gates 320, 322, and 324 couple the nine signals developed on the lines represented by lines 272, 360, and 362 each to a coresponding one of nine lines, represented by three lines, respectively designated 370, 372, and 374, except when the serial output resetting signal developed on line 346 is active (low). For this purpose, one input of each of the gates represented by gates 320, 322, and 324 is connected to the coresponding one of the nine lines represented by lines 272, 360, and 362, the other input of the gates being connected to line 346. The output of each of the gates represented by gates 320, 322, and 324 is connected to the coresponding one of the nine lines represented by lines 370, 372, and 374.

To develop the clocking signal on line 268, FIFO buffer 10 includes a 2-input OR gate configured with one gate input connected to line 216 to receive the serial data (out) clocking signal; with the other gate input connected to line 336 to receive the parallel-output/-serial-output, mode controlling signal; and with the gate output connected to line 268.

Further, FIFO buffer 10 includes nine more multiplexers, represented by three multiplexers, respectively designated 380, 382, and 384. The additional multiplexers, are configured to couple either the nine bit delineating signals developed by control register 204 in the serial mode or the nine parallel (data) output signals developed by FIFO buffer 16 to nine lines, represented by three lines, respectively designated 386, 388, and 390. More specifically, the multiplexers, represented by multiplexers 380, 382, and 384, are configured each with the multiplexer control input connected to line 336; with one of the multiplexer data inputs connected to a coresponding one of the lines represented by lines 272, 360, and 362; with the other one of the multiplexer data inputs connected to a coresponding one of the lines represented by lines 252, 290, and 292; and with the multiplexer data output connected to a coresponding one of the lines represented by lines 386, 388, and 390.

For serial (mode) operation the desired word length is "programmed" by connecting to line 214 one of the (nine lines represented by) lines 386, 388, and 390. Also, a serial extending signal having a high-logic-level is (externally) developed on line 330; and, on line 336, a parallel-input/serial-input, mode controlling signal having a low-logic-level is (externally) developed.

When the serial output resetting signal (externally) developed on line 346 assumes a low-logic level, (the flip flops represented by) flip flops 312, 314, and 316 are "set" to the state in which they develop signals having a high-logic level on (the lines represented by) lines 272, 360, and 362. Thereafter, when the serial output resetting signal (externally) developed on line 346 assumes a high-logic level, the signals developed on (the lines represented by) lines 386, 388, and 390 also assume a high-logic level. Additionally, at this time, a high-logic level signal developed on line 342 (responsive to the high-logic level signal (externally) developed on line 330) is clocked into flip flop 310, causing the flip flop to develop a signal having a high-logic level on line 344.

Since, as previously indicated, one of (the lines represented by) lines 386, 388, and 390 is connected to line 214 (to "program" the desired word length), a signal having a high-logic level is developed on line 210. As a consequence, multiplexer 302 develops at the data input to flip flop 312 on line 354 a signal having a state corresponding to the state of the signal developed on line 344 (a high-logic level). As a further consequence, each of (the multiplexers represented by) multiplexers 304, 306, and 308 develops at the data input of the corresponding flip flop of (the flip flops represented by) flip flops 314, 316, and 318 a low-logic-level signal (corresponding to the level of the signal developed at the multiplexer input which is coupled to the low-logic-level potential).

With the (rising edge of the) next cycle of the serial data (out) clocking signal (externally) developed on line 220, (the flip flops represented by) flip flops 314, 316, and 318 are clocked into the state in which low-logic-level signals are developed on (the lines represented by) lines 360 and 362 and a high-logic level signal is developed on line 284. As a consequence, low-logic-level signals are developed on (the lines represented by) lines 388, and 390 developing a low-logic-level read controlling signal on line 214.

Also with that (rising edge of that) cycle of the serial data (out) clocking signal (externally) developed on line 220, the low-logic-level read controlling signal developed on line 214 causes to be loaded into the flip flops of output register 202 the state of the signals which represent (in parallel format) a data word and which are developed by FIFO buffer 16 on (the lines represented by) lines 252, 290, and 292. Until (the rising edge of) the next cycle of the serial data (out) clocking signal (externally) developed on line 220, a signal is developed on line 262 having a state which represents the first bit of the data word.

With the (rising edge of the) next cycle of the serial data (out) clocking signal (externally) developed on line 220, flip flop 314 is clocked into the state in which a low-logic-level signal is developed on line 388. Also with (the rising edge of) this cycle of the serial data (out) clocking signal (externally) developed on line 220, the data word in the flip flops of output register 202 is shifted causing the state of the signal developed on line 262 to represent the second bit of the data word during this clock cycle.

With the rising edge of subsequent cycles of the serial data (out) clocking signal developed on line 220, other bits of the data word are represented (clocked out). Finally, after a fixed number of cycles of the serial data (out) clocking signal developed on line 220, as determined by the line (of the lines represented by lines 386, 388, and 390) chosen for connection to line 214, the read controlling signal developed on line 214 again returns to the high-logic level, signaling the end of the current data word. With the next rising edge of the serial data (out) clocking signal, signals which are developed by FIFO buffer 16 on lines 252, 290, and 292 and which represent the next data word are loaded (in parallel format) into the flip flops of serial output register 202. Simultaneously, (the flip flops represented by) flip flops 314, 316, and 318 are clocked into the state in which low-logic-level signals are developed on (the lines represented by) lines 360 and 362 and a high-logic level signal is developed on line 284.

For data word lengths longer than nine bits, FIFO buffer 10 is connected in cascade with one or more similar buffers. More particularly, line 370 is connected to the similar line of each of the other buffers, as is line 220. The desired word length is "programmed" by connecting one of (the nine lines represented by) lines 386, 388, and 390 of the appropriate FIFO buffer to line 214 of all of the FIFO buffers. Also, a serial extending signal having a high-logic-level is (externally) developed on line 330 of the first FIFO buffer; and, line 330 of each of the subsequent FIFO buffers is connected to line 390 of the previous FIFO buffer.

In the presently preferred embodiment, the components of FIFO buffer 10 are all integrated into a single device using CMOS technology.

It is contemplated that after having read the preceeding disclosure, certain alterations and modifications of the present invention will no doubt become apparent to those skilled in the art. It is therefore intended that the following claims be interpreted to cover all such alterations and modifications as fall within the true spirit and scope of the invention.

I claim:

1. A programmable FIFO buffer for receiving a plurality of signals representing a word of data in parallel format in a parallel input mode, for receiving a signal representing the data word in serial format in a serial input mode, and for storing the data word, the programmable FIFO buffer comprising in combination:

a plurality of parallel input lines for receiving the parallel format data word signals in the parallel input mode and for receiving at least one signal delineating a current bit of the data word in the serial input mode;

a serial input line for receiving the serial format data word signal in said serial input mode;

a serial input register connected to said serial input line, said serial input register for receiving said serial input line serial format data word signal, for converting the format of said data word to parallel format, and for developing signals representing said converted format data word;

parallel FIFO buffer means for receiving said parallel input lines parallel format data word signals in said parallel input mode, for receiving said serial input register converted format data word signals in said serial input mode, and for storing said data word at a time designated by a write controlling signal;

input coupling means connected to said parallel input lines, to said serial input register, and to said parallel FIFO buffer means, said input coupling means for coupling to said parallel FIFO buffer means said parallel input lines parallel format data word signals in said parallel input mode and said serial input register converted format data word signals in said serial input mode; and an input control register connected to said parallel input lines, to said serial input register, and to said parallel FIFO buffer means, said input control register including a write control line for connection to a predetermined one of said parallel input lines, said input control register for developing said parallel input lines bit delineating signal and for developing said parallel FIFO buffer means write controlling signal.

2. A programmable FIFO buffer as recited in claim 1 wherein said serial input register includes a plurality of flip flops each having a data input connected to said serial input line and a data output connected to said input coupling means.

3. A programmable FIFO buffer as recited in claim 2 wherein each of said serial input register flip flops additionally has enabling input means and wherein said input control register includes a plurality of flip flops each having a data input and data output means, said data output means of each of said input control register flip flops being connected to said input coupling means and being coupled to said enabling input means of a corresponding one of said serial input register flip flops and said data output means of each of said input control register flip flops but one being coupled to said data input of a next one of said input control register flip flops.

4. A programmable FIFO buffer as recited in claim 1 wherein said input control register includes a plurality of flip flops each having a data input and data output means, said data output means of each of said input control register flip flops being connected to said input coupling means and said data output means of each of said input control register flip flops but one being coupled to said data input of a next one of said input control register flip flops.

5. A programmable FIFO buffer as recited in claim 1 wherein said parallel FIFO buffer means additionally develops a plurality of signals representing said stored data word in parallel format at a time designated by a read controlling signal and wherein said programmable FIFO buffer additionally comprises;

a serial output line;

a serial output register connected to said serial output line and to said parallel FIFO buffer means, said serial output register for receiving said parallel FIFO buffer means parallel format stored data word signals, for converting the format of said stored data word to serial format, and for developing on said serial output line a signal representing said converted format stored data word;

a plurality of parallel output lines;

an output control register connected to said parallel FIFO buffer means and to said serial output register, said output control register including a read control line for connection to a predetermined one of said parallel output lines, said output control register for developing at least one signal delineating a current bit of said stored data word in a serial output mode, and for developing said parallel FIFO buffer means read controlling signal; and output coupling means connected to said parallel FIFO buffer means, to said parallel output lines, and to said output control register, said output coupling means for coupling to said parallel output lines said parallel FIFO buffer means parallel format stored data word signals in a parallel output mode and said output control register developed bit delineating signals in said serial output mode.

6. A programmable FIFO buffer for storing a word of data, for developing a plurality of signals representing the data word in parallel format in a parallel mode, and for developing a signal representing the data word in serial format in a serial mode, the programmable FIFO buffer comprising in combination:

parallel FIFO buffer means for storing the data word and for developing the parallel format data word signals at a time designated by a read controlling signal;

a serial output line;

a serial output register connected to said serial output line and to said parallel FIFO buffer means, said serial output register for receiving said parallel FIFO buffer means parallel format data word signals, for converting the format of said data word to serial format, and for developing on said serial output line a signal representing said converted format data word;

a plurality of parallel output lines;

an output control register connected to said parallel FIFO buffer means and to said serial output register, said output control register including a read control line for connection to a predetermined one of said parallel output lines, said output control register for developing at least one signal delineating a current bit of the data word in said serial mode, and for developing said parallel FIFO buffer means read controlling signal; and output coupling means connected to said parallel FIFO buffer means, to said parallel output lines, and to said output control register, said output coupling means for coupling to said parallel output lines said parallel FIFO buffer means parallel format data word signals in said parallel mode and said output control register developed bit delineating signal in said serial mode.

7. A programmable FIFO buffer as recited in claim 6 wherein said serial output register includes a plurality multiplexers each having a first and a second data input and a data output, said first data input of each of said serial output register multiplexers being coupled to said parallel FIFO buffer means and a plurality of flip flops each having a data input and a data output, said data output of each of said serial output register flip flops being coupled to said second data input of a corresponding one of said serial output register multiplexers said data output of one of said serial output register flip flops which is coupled to said serial output line.

8. A programmable FIFO buffer as recited in claim 6 wherein said output control register includes a plurality of flip flops each having a data input and data output means, said data output means of each of said output control register flip flops being connected to said output coupling means and said data output means of each of said output control register flip flops but one being coupled to said data input of a next one of said output control register flip flops.

9. A programmable FIFO buffer as recited in claim 6 wherein said output control register includes a plurality of flip flops each having a data input and a data output, said data output of each of said output control register flip flops being coupled to said output coupling means and a plurality multiplexers each having a first and a second data input, a control input, and a data output, said data output of each of said output control register multiplexers being coupled to said data input of a corresponding one of said output control register flip flops, said first data input of each of said output control register multiplexers but one being coupled to said data output of a previous one of said output control register flip flops, said second data input of each of said output control register multiplexers but one being coupled to a predetermined logic level potential, and said control input of each of said output control register multiplexers being coupled to said read control line.

* * * * *